United States Patent
Lienau

(10) Patent No.: US 6,545,908 B1
(45) Date of Patent: Apr. 8, 2003

(54) DUAL CONDUCTOR INDUCTIVE SENSOR FOR A NON-VOLATILE RANDOM ACCESS FERROMAGNETIC MEMORY

(75) Inventor: Richard M. Lienau, Pecos, NM (US)

(73) Assignees: Pageant Technologies, Inc. (KN); Estancia Limited (KN)

( * ) Notice: Subject to any disclaimer, the term of this patent is extended or adjusted under 35 U.S.C. 154(b) by 0 days.

(21) Appl. No.: 09/691,313

(22) Filed: Oct. 18, 2000

Related U.S. Application Data

(62) Division of application No. 09/516,453, filed on Feb. 29, 2000.
(60) Provisional application No. 60/122,822, filed on Mar. 4, 1999, provisional application No. 60/122,731, filed on Mar. 4, 1999, provisional application No. 60/122,733, filed on Mar. 4, 1999, provisional application No. 60/121,901, filed on Mar. 4, 1999, and provisional application No. 60/121,925, filed on Mar. 4, 1999.

(51) Int. Cl.$^7$ .............................................. G11C 11/18
(52) U.S. Cl. ........................ 365/170; 365/158; 365/171
(58) Field of Search ................................. 365/158, 170, 365/171, 225.5, 230.07

(56) References Cited

U.S. PATENT DOCUMENTS

| 3,048,829 A | 8/1962 | Bradley |
| 3,223,985 A | 12/1965 | Bittmann et al. |
| 3,418,645 A | 12/1968 | Fussell |
| 3,466,634 A | 9/1969 | Gamblin |
| 3,613,013 A | 10/1971 | Vallese ........................ 328/34 |
| 3,714,523 A | 1/1973 | Bate ........................ 317/235 R |
| 3,727,199 A | 4/1973 | Lekven ................. 340/174 TF |
| 4,283,643 A | 8/1981 | Levin ......................... 307/309 |
| 4,360,899 A | 11/1982 | Dimyan ...................... 365/171 |
| 4,607,271 A | 8/1986 | Popovic et al. ............... 357/27 |
| 4,791,604 A | 12/1988 | Lienau ........................... 365/9 |
| 4,803,658 A | 2/1989 | Grimes ......................... 365/87 |
| 4,831,427 A | 5/1989 | Coleman ...................... 357/27 |
| 4,887,236 A | 12/1989 | Schloemann ................ 365/173 |
| 5,065,362 A | 11/1991 | Herdt ......................... 365/154 |
| 5,068,826 A | 11/1991 | Matthews ................... 365/170 |
| 5,075,247 A | 12/1991 | Matthews ................... 365/170 |
| 5,089,991 A | 2/1992 | Matthews ....................... 365/9 |
| 5,107,460 A | 4/1992 | Matthews ................... 365/122 |
| 5,206,590 A | 4/1993 | Dieny ......................... 324/252 |
| 5,208,477 A | 5/1993 | Kub ............................ 257/421 |
| 5,289,410 A | 2/1994 | Katti et al. .................. 365/170 |
| 5,295,097 A | 3/1994 | Lienau ........................ 365/170 |
| 5,329,480 A | 7/1994 | Wu et al. .................... 365/170 |
| 5,329,486 A | 7/1994 | Lage .......................... 365/145 |
| 5,396,455 A | 3/1995 | Brady et al. ................ 365/170 |

(List continued on next page.)

Primary Examiner—Son Mai
(74) Attorney, Agent, or Firm—Jones, Waldo, Holbrook & McDonough; Michael W. Starkweather

(57) ABSTRACT

A nonvolatile ferromagnetic RAM device which is capable of reading the data stored in each magnet quickly and efficiently utilizing a minimal number of components. Specifically there is a nonvolatile ferromagnetic RAM which is capable of reading the data stored in each magnetic bit. The ferromagnetic memory cell, comprising of a base (19) that is oriented in a horizontal plane. There is also a bit (3), made of a ferromagnetic material, having: a height that is oriented perpendicular to the horizontal plane of the base, and a polarity that can be directed along the height. Additionally, there is a sense line (1), positioned proximate the bit (3) sufficient to detect the directed polarity of the bit; and a write line (2), positioned proximate the bit sufficient to direct the polarity of the bit. Additionally, there is a detector, coupled to the sense line; and a sample drive line (14), positioned proximate the bit (3) to transmit an electric pulse that will increase the directed polarity of the bit sufficient to induce a wave into the sense line that can be detected by the detector.

34 Claims, 3 Drawing Sheets

U.S. PATENT DOCUMENTS

| | | | |
|---|---|---|---|
| 5,477,482 A | 12/1995 | Prinz | 365/129 |
| 5,565,695 A | 10/1996 | Johnson | 257/295 |
| 5,579,258 A | 11/1996 | Adachi | 365/145 |
| 5,585,775 A | 12/1996 | Ishishita | 338/32 R |
| 5,652,445 A | 7/1997 | Johnson | 257/295 |
| 5,661,062 A | 8/1997 | Prinz | 438/3 |
| 5,684,397 A | 11/1997 | Ishishita | 324/252 |
| 5,793,697 A | 8/1998 | Scheuerlein | 365/230.07 |
| 5,864,498 A | 1/1999 | Womack | 365/173 |
| 5,926,414 A | 7/1999 | McDowell | 365/170 |
| 5,930,165 A | 7/1999 | Johnson et al. | 365/171 |
| 6,034,887 A | 3/2000 | Gupta et al. | 365/171 |
| 6,140,139 A * | 10/2000 | Lienau et al. | 438/3 |

\* cited by examiner

DUAL CONDUCTOR INDUCTIVE SENSOR FOR A NON-VOLATILE RANDOM ACCESS FERROMAGNETIC MEMORY

RELATED APPLICATION

This is a Divisional Application, its parent application is U.S. application Ser. No. 09/516,453, filed Feb. 29, 2000.

This application claims priority to U.S. Provisional Application No. 60,122,822 filed Mar. 4, 1999.

The following provisional patent applications are related to the present invention:

Prov. Serial No. 60/122,731

Prov. Serial No. 60/122,733

Prov. Serial No. 60/121,901

Prov. Serial No. 60/121,925

THE FIELD OF THE INVENTION

The present invention relates to non-volatile random access memory. More particularly, the present invention relates to a dual conductor inductive. sensor for a non-volatile random access ferromagnetic memory device.

BACKGROUND OF THE INVENTION

Computer memory technology has experienced profound advances in the last two decades. One of the first computer memories involved magnetic core memory technology. To form each magnetic core, a miniature toroidal-shaped ferrite core was interwoven into a fine matrix of wires. By applying a current through the wires, the core would be programmed with either a north or south directed flux path that would correspond to a logic one or zero. The advantage of magnetic core memory is that it is non-volatile, or does not need to be refreshed to remember the stored logic signal. Additionally, Core memory is also "radiation-hard" or unaffected by ionizing radiation like gamma rays. However, the assembly of the magnetic core array was very labor intensive and was quickly abandoned when semiconductor processes were developed.

Currently one of the most popular memory technologies uses either a form of MOS (metal-oxide-semiconductor) or CMOS (complementary metal-oxide-semiconductor) processes. However, it is well known that this technology requires constant refreshing of each memory cell to maintain the logic signal strength due to the inherent leakage of capacitors. This constant refreshing of the memory cells is nota problem when there is an unlimited voltage source, but in many applications, like lap top computers and cell phones, there is a finite supply. To deal with this problem, rechargeable batteries have been used in all portable electrical devices.

The problem with using devices that have capacitive memory arrays is the inconvenience in keeping the batteries properly charged every few hours. Therefore, there is a need for a non-volatile memory device that does not need to be refreshed and is inexpensive and quick to make.

Examples of patents related to non-volatile RAM, each of which are herein incorporated by reference for their supporting teachings, are as follows:

U.S. Pat. No. 4,360,899 to Dimyan et al. teaches a non-volatile random access memory having a plurality of magnetic cells arranged in an array on a major surface of a substrate. In operation, a single magnetic cell is selected and inductively switched between opposite remanent, (i.e. permanent) states, upon the simultaneous application of electrical pulses to a pair of conductors intersecting adjacent the selected cell. Each electrical pulse has an amplitude which is insufficient to inductively switch the remanent state of the selected cell. However, the combined amplitude of the electrical pulses is at least equal to the amplitude required for such a switch.

U.S. Pat. No. 5,068,826 to Mathews teaches a non-volatile, static magentic memory device, whose operation is based on the Hall effect. The device includes a magnetic patch which stores data in the form of a magnetic field, a semiconductor Hall bar, and a pair of integrally-formed bipolar transistors which are used for amplifying and buffering the Hall voltage produced along the Hall bar. In use, current is forced to flow down the length of the Hall bar causing a Hall voltage to be developed in a direction transverse to the direction of both the magnetic field and the current. The bases of the bipolar transistors are ohmically coupled to the Hall bar to sense the Hall voltage—the polarity of which is representative of the stored information. Finally, a system of current carrying conductors is employed for writing data to individual magnetic patches.

U.S. Pat. No. 5,295,097 to Lienau teaches a nonvolatile random access memory having a substrate that carries separate magnetically polarizable domains. Each domain is surrounded by a full write loop member, and arranged to penetrate a Hall channel of a dual drain FET with its residual magnetic field. The domains are organized in word rows and bit columns, are each written to by a single full write current through the surrounding loop member, and each read by a comparator connected to the FET drains. The memory is capable of being fabricated in a variety of different forms.

U.S. Pat. No. 4,791,604 to Lienau et al. teaches a sheet random access memory (SHRAM). The SHRAM is a non-volatile and transportable memory characterized by its cell density and relatively small size and power requirements, but having the nonvolatile character and rugged transportability of core memory, or magnetic disks or tape. The SHRAM is further characterized by a memory comprising a two dimensional magnetic substrate and a fixed driving device for writing and reading into the substrate. Further, a fixed sensing device for sensing the information is attached at each cell location. The memory media includes not only a homogeneous two dimensional substrate, but also ferrite cores formed into the substrate by photolithographic techniques, wherein the information is stored within the core and read by the sensing device from a gap defined by the core. Memory cells according to the invention can thus be arranged and organized to form destructive readout RAMs, or nondestructive readout Rams in both serial and parallel form.

U.S. Pat. No. 5,926,414 to McDowell et al. teaches a magnetic integrated circuit structure in combination with a carrier-deflection-type magnetic field sensor. Each of a variety of magnet structures realize a condition in which the magnetic field is substantially orthogonal to the direction of travel of carriers of a sense current, thereby achieving maximum sensitivity. By basing a magnetic memory cell on a single minimum size MOS device, a small cell may be realized that compares favorably with a conventional DRAM of FLASH memory cell. The greater degree of control over the magnetic field afforded by the magnetic structures enables the cross-coupling between cells in a memory array to be minimized.

SUMMARY OF THE INVENTION

It is therefore a feature of the present invention to provide a nonvolatile ferromagnetic RAM device which is capable of reading the data stored in each magnet quickly and efficiently utilizing a minimal number of components. Specifically, there is a nonvolatile ferromagnetic RAM which is capable of reading the data stored in each magnetic bit.

A further aspect of the invention is to provide a ferromagnetic memory cell, comprising of a base (19) that is oriented in a horizontal plane. There is also a bit (3), made of a ferromagnetic material, having: a height that is oriented perpendicular to the horizontal plane of the base, and a polarity that can be directed along the height. Additionally, there is a sense line (1), positioned proximate the bit (3) sufficient to detect the directed polarity of the bit; and a write line (2), positioned proximate the bit sufficient to direct the polarity of the bit.

Yet, an additional feature of the invention is to provide a memory cell with a detector, coupled to the sense line; and a sample drive line (14), positioned proximate the bit (3) to transmit an electric pulse that will increase the directed polarity of the bit sufficient to induce a wave into the sense line that can be detected by the detector.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

It is noted that the drawings of the invention are not so scale. The drawings are merely schematic representations, not intended to portray specific parameters of the invention. The drawings are intended to depict only selected embodiments of the invention, and therefore should not be considered to be limiting the scope of the invention. The invention will be described with additional specificity and detail through the use of the accompanying drawings. Like numbering between figures represent like elements.

DETAILED DESCRIPTION OF THE INVENTION

Figure 1:
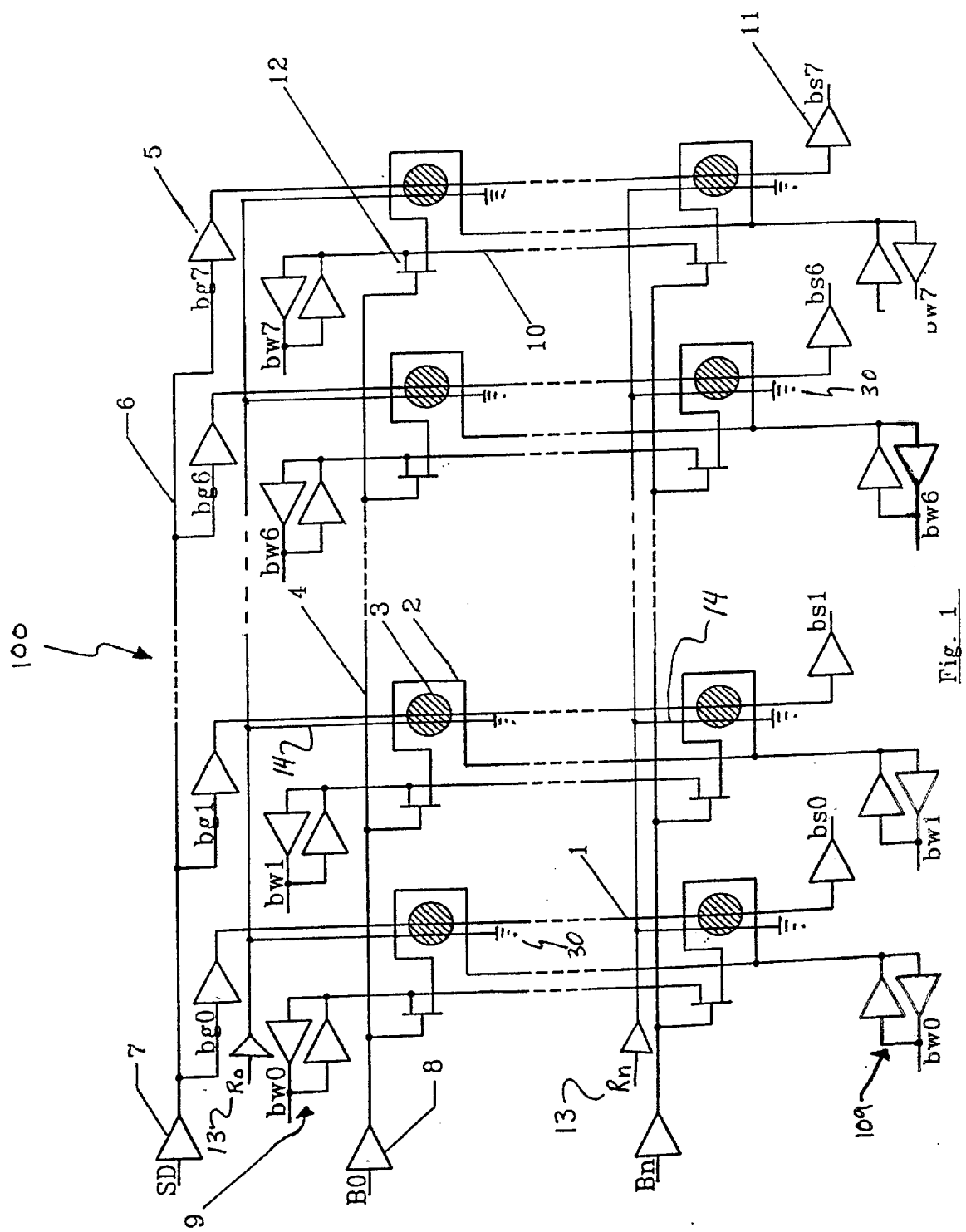
FIG. 1 is a schematic diagram of the nonvolatile random access ferromagnetic memory of the present invention.

The applicant has discovered that the reading of binary data stored within a ferromagnetic bit may be accomplished easily and efficiently using a dual conductor inductive sensor in intimate communication therewith. Such a device requires no moving parts or refreshing of stored logic signals, and is capable of sensing magnetically stored data at the micron and submicron levels. Referring now to FIG. 1, there is shown an electrical schematic diagram of the inventive nonvolatile random access ferromagnetic memory circuitry 100. In particular, there are ferromagnetic bits 3, each surrounded by a "set" or "write" coil 2. Isolation gates (FETs or field effect transistors) 12 are electrically coupled to bit drive lines 10 that are coupled to bit write drivers 9. Master sense driver 7 is electrically coupled through master sense drive line 6, to bit read isolation gates (or operational amplifiers) 5, that are coupled to conductor sense lines 1, which are coupled to bit sense amplifiers 11. Read drivers 13 are each coupled to read drive lines 14, which are each coupled to ground 30. Byte drivers 8 are coupled to byte drive lines 4, which are coupled to write coils 2. Cross selection between byte drive lines 4, and bit drive lines 10, are prevented by gates 12.

Figure 2:
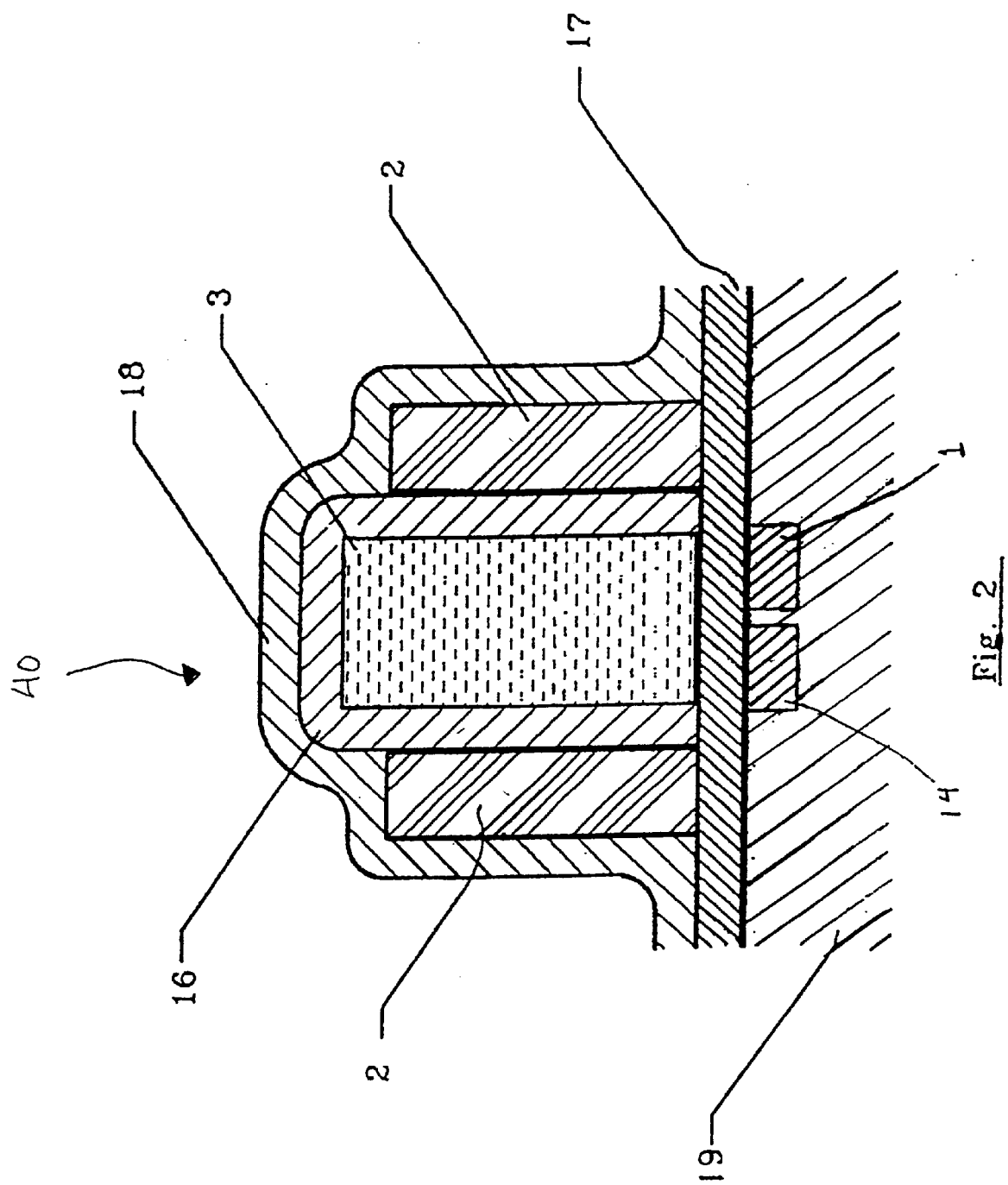
FIG. 2 is a side sectional view of the memory cell elements presented in FIG. 1.

Referring to FIG. 2, there is illustrated a side cross sectional view of the micron, or sub-micron memory cell elements of FIG. 1. In particular, memory cell 40 has substrate 19 imbedded with sense line 1 and read bias pulse drive line, or sample drive line 14 placed side-by-side therein. In this embodiment, these lines are illustrated as being placed at the bottom of the magnet, however, they could both be placed at the top of the magnet, or with one on the top and one on the bottom and still achieve the same results. Sense line 1 and bias pulse drive line 14, may be made of any suitable conductive material known to those skilled in the art such as Al, Cu, etc. Insulation layer 17 is placed over sense line 1 and bias pulse drive line 14, which may be of any suitable insulative material known to those skilled in the art such as $SiO_2$, $Si_3N_4$. A ferromagnetic memory bit 3 is surrounded by a layer of insulation 16. Write coil 2 surrounds insulation layer 16 proximate to the memory bit. Write coil 2 may be of the same conductive materials as sense line 1 and bias pulse line drive 14. Insulation layer 16 may be of the same insulative materials as insulation layer 17. A final covering insulation layer 18 is placed over all exposed surfaces of memory cell 40 which also may be of the same insulative materials as insulation layer 16. The entire memory cell 40 is disposed upon substrate, 19 which can be made of any suitable substrate material known to those skilled in the art such as silicon, glass, and GaAs. Further, substrate 19 and memory cell 40 may be fabricated by any method known to those skilled in the relevant art, such as electroplating, sputtering, E-beam deposition, chemical vapor deposition, and molecular beam epitaxy.

Figure 3:
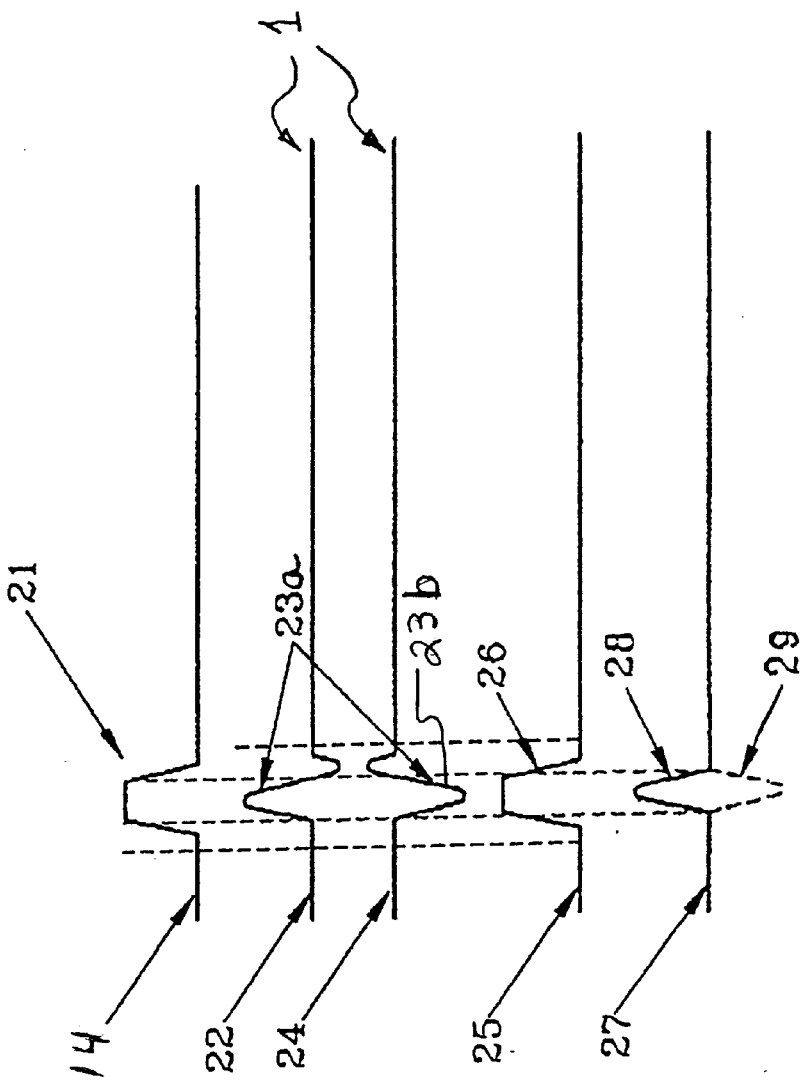
FIG. 3 is a timing diagram of the memory cell elements of FIG. 1 for reading a single positive bit of data stored in a memory cell.

Referring now to FIG. 3, there is illustrated a timing diagram of the memory cell elements of FIG. 1 for reading a single positive bit of data stored in an individual memory cell. Such a positive bit would represent a digital "1" with its positive "H" magnetic field. During the reading of the magnetic bit, sense sample pulse 21 is generated on bias pulse read drive line 14, and results in a field which induces a pulse into sense line 1 of FIG. 1. Additionally, pulse 21 will interact with the static, or remnant magnetic field emanating from ferromagnetic bit 3. The resultant interaction between these two fields is sense wave 23, which is produced on the sense conductor (i.e., sense line 1) depicted on lines 22 and 24, depending upon the logic signal previously stored. Specifically, as depicted on line 22, the sense wave 23 is positive as a result of the positive magnetic field. Conversely, line 24 shows the negative going sense-wave 23 that will result from a negative magnetic field.

In each case, sense strobe 26 on timing line 25 gates the frontal portion of the sense wave, which will in turn be felt at the output of bit sense amplifiers 11, as pulses 28 or 29 on timing line 27. Thus the magnetic polarity, or digital value of each ferromagnetic bit, can be determined.

Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function, manner of operation, assembly, and use may be made without departing from the principles and concepts set forth herein.

What is claimed is:

1. The ferromagnetic memory cell, comprising:
   a) a bit, having:
      1) a central point located approximately at a center of the bit;
      2) a outside surface, defining an outer periphery of the bit located furthest from the central point; and
      3) a mass of ferromagnetic material located between the central point and the outside surface;
   b) a write line, positioned around at least a portion of the outside surface sufficient to direct the polarity of the bit;
   c) a sample drive line, positioned separate from the write line but proximate the bit to transmit an electric pulse that will increase the directed polarity of the bit;
   d) a sense line, positioned proximate the bit sufficient to detect the increased directed polarity of the bit;
   wherein a wave is induced into the sense line as a result of the increased directed polarity;
   wherein the wave induced into the sense line is a positive wave and represents a binary "1"; and
   wherein the sense line and the sample drive line are on opposite ends of the bit.

2. The memory cell of claim 1, wherein the wave induced into the sense line is a negative wave and represents a binary "0".

3. The memory of cell of claim 1, wherein the sense line and the sample drive line are on opposite ends of the bit.

4. The memory cell of claim 1, wherein the sense line is coupled to an output sense amplifier.

5. The memory cell of claim 1, wherein the bit will not loose its directed polarity after the sample drive line transmits an electric pulse that will increase the directed polarity of the bit.

6. The ferromagnetic memory cell, comprising:
   a) a bit, having:
      1. a central point located approximately at a center of the bit;
      2. an outside surface, defining an outer periphery of the bit located furthest from the central point; and
      3. a mass of ferromagnetic material located between the central point and the outside surface;
   b) a write line, positioned around at least a portion of the outside surface sufficient to direct the polarity of the bit;
   c) a sample drive line, positioned separate from the write line but proximate the bit to transmit an electric pulse that will increase the directed polarity of the bit;
   d) a sense line, positioned proximate the bit sufficient to detect the increased directed polarity of the bit; and
   wherein the sense line and the sample drive line are on opposite ends of the bit.

7. The memory cell of claim 6, wherein a wave is induced into the sense line as a result of the increased directed polarity.

8. The memory cell of claim 6, wherein the wave induced into the sense line is a negative wave and represents a binary "0".

9. The memory cell of claim 6, wherein the sense line and the sample drive line are disposed in a substrate and located below the bit.

10. The memory of cell of claim 6, wherein the sense line and the sample drive line are on opposite ends of the bit.

11. The memory cell of claim 6, wherein the sense line is coupled to an output sense amplifier.

12. The memory cell of claim 6, wherein the bit will not loose its directed polarity after the sample drive line transmits an electric pulse that will increase the directed polarity of the bit.

13. The ferromagnetic memory cell, comprising:
    a) a bit, having:
       1) a central point located approximately at a center of the bit;
       2) an outside surface, defining an outer periphery of the bit located furthest from the central point; and
       3) a mass of ferromagnetic material located between the central point and the outside surface;
    b) a write line, positioned around at least a portion of the outside surface sufficient to direct the polarity of the bit;
    c) a sample drive line, positioned separate from the write line but proximate the bit to transmit an electric pulse that will increase the directed polarity of the bit;
    d) a sense line, positioned proximate the bit sufficient to detect the increased directed polarity of the bit; and
    e) an output sense amplifier, coupled to the sense line.

14. The memory cell of claim 13, wherein a wave is induced into the sense line as a result of the increased directed polarity.

15. The memory cell of claim 14, wherein the wave induced into the sense line is a positive wave and represents a binary "1".

16. The memory cell of claim 14, wherein the wave induced into the sense line is a negative wave and represents a binary "0".

17. The memory cell of claim 14, wherein the sense line and the sample drive line are disposed in a substrate and located below the bit.

18. The memory of cell of claim 13, wherein the sense line and the sample drive line are on opposite ends of the bit.

19. The memory cell of claim 13, wherein the bit will not loose its directed polarity after the sample drive line transmits an electric pulse that will increase the directed polarity of the bit.

20. A ferromagnetic memory cell, comprising:
    a) a ferromagnetic bit, designed to store a directed polarity having an outside surface;
    b) a write line, positioned around at least a portion of an outside surface sufficient to direct the polarity of the bit; and
    c) read means, positioned proximate the bit and spaced from the write line, for reading the directed polarity of the bit without destroying the directed polarity by first exciting the directed polarity and reading the excited polarity;
    wherein the read means includes a sample drive line, positioned separate from the write line but proximate the bit to transmit an electric pulse that will increase the directed polarity of the bit;
    wherein the read means includes a sense line, positioned proximate the bit sufficient to detect the increased directed polarity of the bit;
    wherein the increased directed polarity creates a wave into the sense line; and
    wherein the sense line and the sample drive line are disposed in a substrate and located below the bit.

21. The memory cell of claim 20, wherein the wave induced into the sense line is a negative wave and represents a binary "0".

22. The memory cell of claim 20, wherein the wave induced into the sense line is a positive wave and represents a binary "1".

23. The memory cell of claim 20, wherein the sense line and the sample drive line are on opposite ends of the bit.

24. The memory cell of claim 20, wherein the sense line is coupled to an output sense amplifier.

25. A ferromagnetic memory cell, comprising:
   a) a ferromagnetic bit, designed to store a directed polarity having an outside surface;
   b) a write line, positioned around at least a portion of an outside surface sufficient to direct the polarity of the bit; and
   c) read means, positioned proximate the bit and spaced from the write line, for reading the directed polarity of the bit without destroying the directed polarity by first exciting the directed polarity and reading the excited polarity;
   wherein the read means includes a sample drive line, positioned separate from the write line but proximate the bit to transmit an electric pulse that will increase the directed polarity of the bit;
   wherein the read means includes a sense line, positioned proximate the bit sufficient to detect the increased directed polarity of the bit;
   wherein the increased directed polarity creates a wave into the sense line; and
   wherein the sense line and the sample drive line are on opposite ends of the bit.

26. The memory cell of claim 25, wherein the wave induced into the sense line is a positive wave and represents a binary "1".

27. The memory cell of claim 25, wherein the wave induced into the sense line is a negative wave and represents a binary "0".

28. The memory cell of claim 25, wherein the sense line and the sample drive line are disposed in a substrate and located below the bit.

29. The memory cell of claim 25, wherein the sense line is coupled to an output sense amplifier.

30. A ferromagnetic memory cell, comprising:
   a) a ferromagnetic bit, designed to store a directed polarity having an outside surface;
   b) a write line, positioned around at least a portion of an outside surface sufficient to direct the polarity of the bit; and
   c) read means, positioned proximate the bit and spaced from the write line, for reading the directed polarity of the bit without destroying the directed polarity by first exciting the directed polarity and reading the excited polarity;
   d) an output sense amplifier coupled to the sense line;
   wherein the read means includes a sample drive line, positioned separate from the write line but proximate the bit to transmit an electric pulse that will increase the directed polarity of the bit;
   wherein the read means includes a sense line, positioned proximate the bit sufficient to detect the increased directed polarity of the bit; and
   wherein the increased directed polarity creates a wave into the sense line.

31. The memory cell of claim 30, wherein the wave induced into the sense line is a positive wave and represents a binary "1".

32. The memory cell of claim 30, wherein the wave induced into the sense line is a negative wave and represents a binary "0".

33. The memory cell of claim 30, wherein the sense line and the sample drive line are disposed in a substrate and located below the bit.

34. The memory cell of claim 30, wherein the sense line is coupled to an output sense amplifier.

* * * * *